Aug. 9, 1960 M. V. KALFAIAN 2,948,834

PRINTED CIRCUIT WIRING

Filed Nov. 10, 1958

SOCKETS, SHOWING FILAMENT PRONGS BENT BEFORE MOUNTING

INVENTOR.

Magar V. Kalfaian

United States Patent Office 2,948,834

Patented Aug. 9, 1960

2,948,834

PRINTED CIRCUIT WIRING

Meguer V. Kalfaian, 962 Hyperion Ave.,
Los Angeles 29, Calif.

Filed Nov. 10, 1958, Ser. No. 773,066

2 Claims. (Cl. 317—101)

This invention relates to constructional design of printed circuit devices, and more particularly to a structurally improved design of printed wiring for the filament supply of vacuum tubes used therewith. Its main object is to provide structurally a separate board of printed wiring solely devoted to filament supply of vacuum tubes. A corollary object is to provide printed wiring of filament supply, with current carrying capabilities to a large number of vacuum tubes that normally draw high current, without subject to voltage drop, or heating problems involved therewith. A further object of the present invention is to provide a shielding means, that will highly eliminate coupling of filament supply alternating voltage to signal carrying terminals of the complete printed circuit wiring structure.

The use of printed circuit wiring has in the recent years expanded in the manufacture of electronic devices. Printed circuit wiring has proven to be an excellent base for mounting electronic component parts and transistors. In circuitry where vacuum tubes with high filament current draw are used, however, a problem arises of providing thick electrical conductors for the required current of the tubes. The printed wiring usually consists of etched conductor about 10 mils thick in narrow strips, bonded to an insulating board, such as, phenolic, epoxy glass, etc. These narrow strips of thin conductors, such as copper, are often insufficient to carry the large amount of current necessary for a large number of vacuum tubes used in the device. Then again, these narrow strips of copper are sometimes in close proximity with critical signal carrying terminal strips, and the capacitive coupling between the two cause injection of the alternating filament supply voltage into the signal carrying terminal strips. Where high gain amplification is utilized, such injection of the alternating filament voltage into the signal terminal, no matter how small in magnitude may be, becomes highly undesirable. For this reason, the printed wiring board is sometimes accompanied by separate filament wires attached thereto. Even with the latter arrangement, although provided with sufficient amount of current carrying capacity by the use of thick copper wire, it often becomes necessary to shield these wires where critical circuitry is involved. For these reasons, therefore, the principal object of the present invention is to provid a structural arrangement of printed circuit wiring that will not only provide the necessary current carrying capacity, but will also provide shielding between filament and signal terminals to a high degree unobtainable with ordinary arrangements. The constructional arrangement of the present invention will be better understood from the following specification when read in connection with the accompanying drawings, wherein:

*Filament board*

Figure 1:
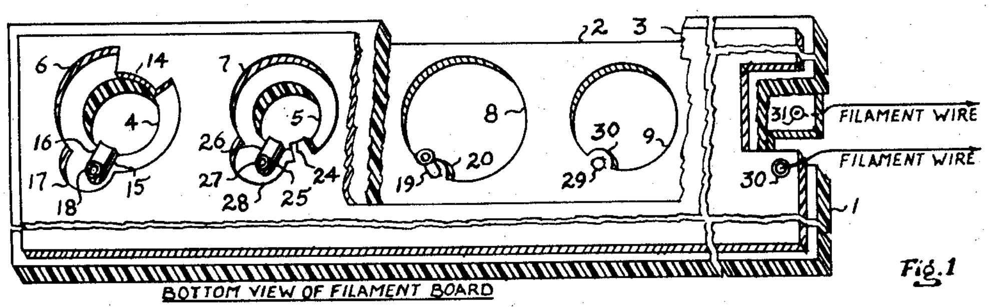
Fig. 1 is a three dimensional broken view of the filament-supply-carrying printed board according to the invention.

Referring now to Fig. 1, an insulating board 1 is bonded on both of its planar surfaces with electrically conductive material, for example, copper sheets 2 and 3. The insulating board 1 is drilled in large holes at predetermined locations, such as the holes 4, 5, where mounting sockets of the vacuum tubes are to be placed at. These holes are made large enough for insertion of the socket terminal prongs; but stopping at the seated ends of said prongs. Where these holes are located on the insulating board, the copper sheets 2 and 3 are etched in larger diameters, such as shown by holes 6, 7 on sheet 3, and by the holes 8, 9 on sheet 2, so that any possibility of making electrical contacts of socket prongs with that of the copper sheets 2 and 3 is avoided, in inserted position. The contour of socket holes in copper sheets 2 and 3 is not circular, and the shape depends upon the circular location of the filament prongs on the mounting sockets. For example, referring to Fig. 4, a certain nine pin miniature tube may have its filament terminals located at pins 4, 5, 9, as shown by the bent prongs 10, 11 and 12 of socket 13. For a 12 volt filament supply, the filament prongs 10 and 11 may be used, and for a 6 volt filament supply, the prongs 10, 11 may be connected in parallel, and these used together with prong 12. Assuming the use of 6 volt filament supply, the prongs 10, 11 and 12 of socket 13 would be located in the areas 14 and 15 of Fig. 1, when the rest of the prongs of said socket are inserted through the hole 4, from top side of the filament board. The filament connections of prongs 10, 11 would then be terminated electrically to the copper sheet 3 in the area 14, by soldering same, and the filament connection of prong 12 be terminated electrically to the copper sheet 2, by soldering said prong to the copper strip 16. The copper sheet 3 is recessed in the area 15, so that the copper strip 16 is electrically insulated from the copper sheet 3. Electrical connection from copper strip 16 to the copper sheet 2 is effected by a conductive rivet, or eyelet 18, which joins the two copper conductors through a hole in the insulating board 1. The position of the conductor eyelet is revealed more clearly in the broken section of the illustration, wherein a similar eyelet bears the numeral 19. In order to effect said electrical termination between the copper sheet 2 and said coppr strips 16, the holes on copper sheet 2, for example, the hole 8, is provided with substantial copper extensions, for example, the extension 20 in hole 8, so that the said eyelets, for example, eyelet 19, may be mechanically and electrically attached thereto. It is thus seen that the prongs 10, 11 and 12 of socket 13 in Fig. 4 may be first bent 90 degrees from their normal longitudinal projections, as shown in the drawing, and insert the unbent prongs through the hole 4 of insulator board 1 in Fig. 1, from top side of said board, until said bent prongs rest upon the copper sheet 3, in area 14, and on copper strip 16, in area 15, wherefore the prongs 10, 11 and 12 soldered to the prescribed copper areas for fixed mounting.

Figure 5:
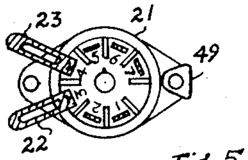
Fig. 5 shows how the filament-terminal prongs of a seven pin socket are separated from the signal-terminal prongs, prior to mounting on the filament wire carrying printed board, also showing a socket-mounting hook attached to one end of the socket for mounting the socket on a front panel.

When a seven pin miniature vacuum tube is to be mounted, the receptacle socket 21 may, for example, be as shown in the drawing of Fig. 5, with filament prongs, for example, 22 and 23, which are also bent 90 degrees from their normal longitudinal projections. When the unbent prongs of socket 21 are inserted through the hole 5 from top side of the insulator board 1 in Fig. 1, the prong 23 would now be located in the area 24 of copper sheet 3, and the prong 22 located in the area 25 where a copper strip 26 is joined in electrical connection with the copper sheet 2 by an electrically conductive rivet or eyelet 27, in the same manner as described by way of the eyelet 18. Also, as previously described, the conductive sheet 3 is recessed at 28, so as to allow insulation clearance between the conductive strip 26 and the conductive sheet 3. As will be noted, the seven pin socket is physically smaller in diameter than the nine pin socket, and accordingly, the hole through the board is made smaller for mounting the former socket. The hole 9 on conductive sheet 2 in the broken area of the drawing shows the location of the pin-hole 29 for an eyelet to be inserted therethrough, and the extended part 30 of the sheet 2, for mechanical mounting of same.

With the detailed specification given above, it is seen that a large area of conductive material can be provided for the filament terminals of the vacuum tubes used in a printed circuit device. Actual tests have proven that with ordinary thickness of copper sheet on an insulating board, as used for general commercial purposes, a large number of vacuum tubes can be provided with the necessary current delivery without any filament voltage drop measurable at any point on the surface area of the metal sheet. For example, in one particular device, there were used 21 vacuum tubes on a board measuring 11 inches long by 5 inches wide; with a total filament current of 7 amperes, at 6 volts A.C. When the tubes were lit, all corners of the metal sheet were probed with no indication of any voltage drop on a sensitive voltmeter; although theoretically some voltage drop inevitably exists. This measurement indicates that the metal sheet could provide current for much heavier duty tubes. Of course when extremely heavy duty tubes are employed, the bonded metal sheet could be thicker than the ones used for general purposes. The filament leads from a source can be terminated to the copper sheets 2 and 3 at some convenient points, for example, to the eyelets located at 30 and 31.

The structural design of the filament board could by no means be limited to the design as shown in Fig. 1. For example, instead of providing singular large holes 4, 5, in the insulating board 1, smaller holes can be drilled in the insulating board for the signal prongs, for example, the prongs located at socket numerals 1 to 3 and 6 to 8 in Fig. 4, for insertion therethrough and mounting thereof. Such mechanical variations in assembly structure is familiar and easily understandable to the skilled in the art, and accordingly, it is not found necessary to include additional drawing for such minor but relative variations in structure. Also, it is by no means necessary that the filament prongs of the receptacle socket be soldered to only one planar side of the filament board, as shown. For example, the metal strips 16 and 26 (including the eyelets 18, 27) can be eliminated, and the filament prongs that are to have electrical connections with the copper sheet 2 can be inserted through the holes 4, 5 and soldered directly onto the copper sheet 2. These variations in practice may be chosen by the manufacturer, as may be found more suitable for its purpose.

*Cross-sectional view of complete assembly*

Figure 2:
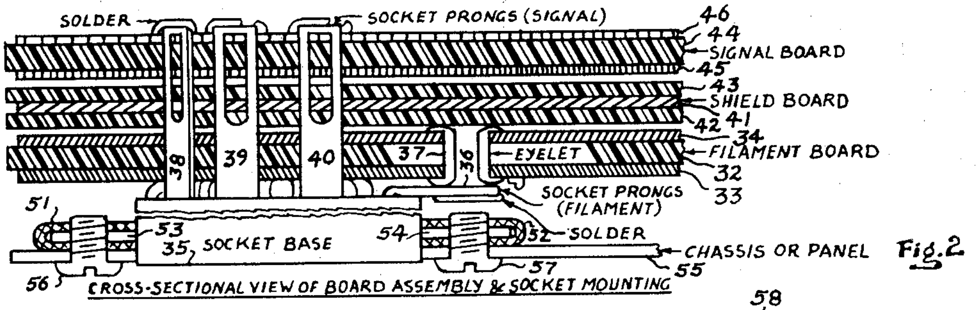
Fig. 2 is a cross-sectional view of the complete assembly of filament and signal carrying printed wiring boards with a shield included therebetween; also showing how a receptacle socket for a vacuum tube is mounted therein.

Fig. 2 is a cross-sectional view of the complete printed board assembly, wherein, the filament board consists of insulating board 32, and copper sheets 33, 34 bonded on both of its planar surfaces. The receptacle socket 35 (of a vacuum tube) is shown with one filament prong 36 soldered to an eyelet 37, and the signal prongs 38, 39, 40 inserted through clearance holes in filament board comprising insulating board 32, bonded metal-sheets 33, 34 on both of its planar surfaces; through clearance holes in shield board comprising metal sheet 41, and insulating sheets 42, 43 utilized for avoiding said shield making electrical contact with electrical conductors on adjacent boards; and through clearance holes in the signal board comprising insulating board 44, both planar surfaces of which are covered with conductive metal 45, 46 in the form of a plurality of strips integrally united to the insulating board 44, said strips constituting a wiring arrangement of an electrical circuitry. The socket prongs 38—40 are then soldered to last said strips, as illustrated in the drawing.

Figure 4:
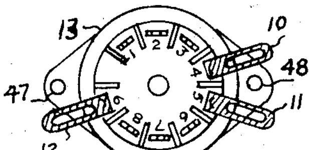
Fig. 4 shows how the filament-terminal prongs of a nine pin socket are separated from the signal-terminal prongs, prior to mounting on the filament wire carrying printed board.
Figure 6:
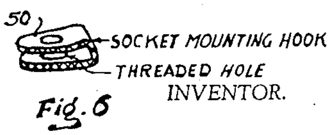
Fig. 6 shows a socket-mounting hook, two of which are attached to each of the mounting sockets for mounting same on a chassis or front panel.

The receptacle sockets as shown in Figs. 4 and 5 are ordinarily manufactured for commercial purposes. These sockets usually have mounting holes 47, 48, as shown on socket 13, and the mounting on either a chassis or a front panel is accomplished with screws and nuts of the proper size. In reference to the assembly as shown in Fig. 2, however, the chassis or panel would obstruct manipulation of said screws and nuts, either by hand or by automatic insertion machine. In this case, it is required that the holes 47, 48 on socket 13 be threaded. Since these sockets are already manufactured in large quantities with unthreaded mounting holes, and it would take special tooling for the modification, a simple threaded attachment may be added to the socket; one of which is shown added to the socket 21 in Fig. 5, as designated by the numeral 49. Fig. 6 illustrates this attachment 50 more clearly, which can be easily mass produced on a stamping machine cut out of sheet metal. The threaded hole can be formed by an impression on the metal in conformity with the threaded pitch diameter of the size of screws intended to be used for mounting. Of course, the shape of the attachment, as shown, can vary in design; the main purpose being the provision of threaded mounting holes. Also, if so desired, the sockets may be manufactured in a modified form, to comply both with regard to electrical and mechanical requirements of the assembly given in Fig. 2. Relative to the attachment of Fig. 6, however, Fig. 2 illustrates how such an attachment is utilized for mounting the assembly to a chassis or a front panel. These attachments 51 and 52 are first hooked onto the flanged portions 53, 54 of the socket, as illustrated, and mounted on the panel 55 with screws 56 and 57.

*Top view of printed wiring board*

Figure 3:
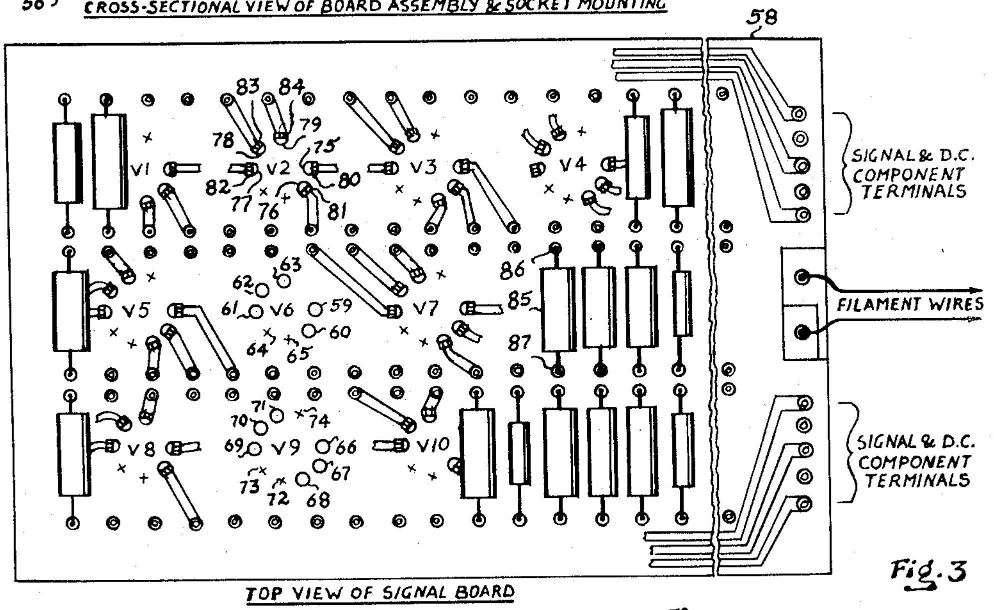
Fig. 3 is a top view of the signal-carrying printed-wiring board, showing the positions of output terminals for signal and filament wire connections; also showing how the signal and filament terminal prongs of vacuum tube sockets are separated from each other; including a desirable arrangement of mounting component parts on the signal board.

Fig. 3 shows a typical arrangement of the top side of the signal board. There are shown ten sockets mounted, designated as V1 to V10, with various stages of processing, as an illustrative aid to the descriptive matter. For example, V6 shows five holes, 59 to 63, for the prongs of a seven pin socket to be inserted therethrough from behind the board. It will be noted that the crossed locations 64 and 65 are without holes, as the socket prongs at these locations are already terminated to the filament board behind of the board 58. The location of V9 is shown for a nine pin socket, which in the previous manner, contains holes 66 to 71, and the crossed locations 72 to 74 are left blank, as these are the locations for the filament prongs of the socket. The location of V2 is shown for a seven pin socket with the prongs inserted therethrough. The holes for these prongs are designated by the numerals 75 to 79, and the prongs are designated by the numerals 80 to 84. After insertion of the prongs 80 to 84 through corresponding holes 75 to 79, they are bent outwardly upon the copper strips, representative of the printed wiring (these strips are not designated in the drawing to avoid crowding by numerals), and soldered onto said strips; completing the socket wiring assembly. The socket locations at V1, V3—V5, V7, V8 and V10 are further illustrations of the mechanical and electrical assembly of sockets. After completing the socket assembly, the component parts, for example, part 85, are mounted and soldered in eyelets, for example, eyelets 86 and 87; the practice of the latter of which is conventional. Also, the board 58 may either have printed wiring on both of its planar surfaces, such as shown by the numerals 45 and 46 in Fig. 2, or printed circuit wiring only on one of its surfaces, as required for a particular purpose. Further, in view of simplicity and better results, I have found that circuit arrangements comprising a sizable quantity of tubes and component parts, a layout in straight rows, such as illustrated in the drawing of Fig. 3, instead of the generally practiced zig-zag layout, will provide the best arrangement for any complicated circuitry, both in simplicity of making the printed circuit drawing, and providing short leads to critical terminals, thereby avoiding many of the functional difficulties that are often encountered in high frequency practice by improper wiring arrangements.

While the foregoing specification, and the drawings thereof, point to the basic principles embodied in the present invention, it is wished to be understood that these are only exemplary in the limitation of the present disclosure, as various modifications, substitutions and adaptations may be made without departing from the spirit and scope of the present invention. For example, it will be readily obvious to the skilled in the art, that, the filament wiring sheets 2 and 3 in Fig. 1 may be divided into various patterns for supplying current to tubes having filament connections separate one from another.

What I claim is:

1. In an electrical alternating voltage filament supply assembly highly critical to filament voltage radiation to adjacent electrical assembly, an assembly structure for providing high filament currents to a plurality of electrical discharge devices, and for suppressing filament voltage radiation from current carrying conductors to adjacently located electrical assembly, said assembly comprising a first insulating sheet; a first planar conductor on one surface, and a second planar conductor on the other surface of said sheet, said conductor surfaces having large surface areas and said sheet being substantially thin, so as to provide large capacitive coupling and large electric field between the two conductor surfaces, thereby confining said conductor radiation within said field, including provision of large current carrying surfaces; plurality of receptacle sockets for said plurality of electric discharge devices, having at least first and second filament terminating prongs; prelocated mounting holes in said first sheet and said first and second surfaces for insertion of the prongs of said sockets; means for inserting the prongs of said sockets through said holes from the first conductor surface, and means for electrically terminating said first and second filament terminating prongs with that of said first and second conductor surfaces, respectively; a second insulating sheet overlying said second conductor surface; and a third conductor surface overlying the second insulating sheet, and means for terminating last said conductor to a common ground terminal, for further suppressing residual remains of said filament conductor radiation.

2. The electrical assembly structure as set forth in claim 1, wherein is included a third insulating sheet overlying said third conductor sheet; and means for assembling said adjacently located electrical assembly over said third insulating sheet, so as to isolate last said assembly from said filament assembly by said third conductor grounding surface.

References Cited in the file of this patent

UNITED STATES PATENTS

| | | |
|---|---|---|
| 1,718,993 | Wermine | July 2, 1929 |
| 2,066,876 | Carpenter | Jan. 5, 1937 |
| 2,508,030 | Karns | May 16, 1950 |